(12) United States Patent
Wang

(10) Patent No.: US 11,411,257 B2
(45) Date of Patent: Aug. 9, 2022

(54) HOT SWAP BATTERY MODULE AND CONTROL METHOD THEREOF

(71) Applicants: Chin-Ho Wang, New Taipei (TW); Hsiao-Yang Wang, New Taipei (TW)

(72) Inventor: Chin-Ho Wang, New Taipei (TW)

(73) Assignees: Chin-Ho Wang, New Taipei (TW); Hsiao-Yang Wang, New Taipei (TW)

( * ) Notice: Subject to any disclaimer, the term of this patent is extended or adjusted under 35 U.S.C. 154(b) by 352 days.

(21) Appl. No.: 16/820,999

(22) Filed: Mar. 17, 2020

(65) Prior Publication Data

US 2021/0203011 A1 Jul. 1, 2021

(30) Foreign Application Priority Data

Dec. 25, 2019 (TW) ................... 108147541

(51) Int. Cl.
*H01M 10/42* (2006.01)
*B60K 1/04* (2019.01)
*H01L 29/866* (2006.01)
*H01M 50/20* (2021.01)

(52) U.S. Cl.
CPC ............. *H01M 10/425* (2013.01); *B60K 1/04* (2013.01); *H01L 29/866* (2013.01); *H01M 50/20* (2021.01); *H01M 2010/4271* (2013.01)

(58) Field of Classification Search
CPC ............... H01M 10/425; H01M 50/20; H01M 2010/4271; B60K 1/04; H01L 29/866
See application file for complete search history.

(56) References Cited

U.S. PATENT DOCUMENTS

2013/0266826 A1* 10/2013 Cowperthwaite ... H01M 50/296
  29/25.42
2015/0180257 A1* 6/2015 Snyder ................ H01M 10/425
  320/137

\* cited by examiner

*Primary Examiner* — David V Henze-Gongola
(74) *Attorney, Agent, or Firm* — Rosenberg, Klein & Lee

(57) ABSTRACT

A hot swap battery module uses a smart chip and an ideal diode controller to control a power transistor so as to implement a multi-step charge or discharge. Consequently, battery modules which have different voltages or battery capacities can be immediately connected in parallel. When the hot swap battery module is hot swapped, the hot swap battery module also can avoid an excessive charge current or discharge current to damage itself.

25 Claims, 4 Drawing Sheets

HOT SWAP BATTERY MODULE AND CONTROL METHOD THEREOF

This application claims priority for Taiwan patent application no. 108147541 filed on 25 Dec. 2019, the content of which is incorporated by reference in its entirely.

BACKGROUND OF THE INVENTION

Field of the Invention

The present invention relates to a battery module, particularly to a hot-swap battery module and a control method thereof.

Description of the Related Art

Because electric vehicles and energy storage systems demand higher and higher battery capacity, a single battery module has been hard to meet requirement. Thus, several battery modules are connected in parallel to increase battery capacity. However, different types of battery modules respectively have different voltages/capacities. Even though the battery modules are of the same type, they may have different voltages/capacities after different usage times. If the battery modules with different voltages/capacities are connected in parallel, great current may flow into the battery modules with smaller voltages/capacities, damaging the battery modules, shortening the service life, even causing fire or explosion.

Therefore, it is desired that a battery module can be immediately connected in parallel regardless of its voltage/capacity.

SUMMARY OF THE INVENTION

One objective of the present invention is to provide a hot-swap battery module and a control method thereof.

Another objective of the present invention is to provide a battery module which can be immediately connected in parallel without considering voltage/capacity.

Yet another objective of the present invention is to provide a battery module which can prevent current from reversely charging batteries, and a method thereof.

Still another objective of the present invention is to provide a battery module which can prevent from too high a charging current, and a method thereof.

Yet still another objective of the present invention is to provide a battery module which can prevent from too high a discharging current, and a method thereof.

A further objective of the present invention is to provide a battery module which determines the operation mode according to the voltage of the output, and a method thereof.

The present invention proposes a hot-swap battery module, which comprises a voltage terminal, a battery, a discharge switch, a charge switch, a first power transistor, a smart chip, and an ideal diode controller. The discharge switch, the charge switch and the first power transistor are connected in series between the voltage terminal and the battery. While a first voltage provided by the battery is smaller than a second voltage of the voltage terminal, the smart chip turns off the first power transistor. While a third voltage of a first terminal of the first power transistor is larger than a fourth voltage of a second terminal of the first power transistor, the ideal diode controller turns off the first power transistor. The first terminal of the first power transistor is coupled to the voltage terminal, and the second terminal of the first power transistor is coupled to the battery.

In one embodiment, the hot-swap battery module further comprises a discharge circuit. The discharge circuit is connected with the charge switch, the discharge switch and the first power transistor in parallel. The discharge circuit forms a discharge path between the battery and the voltage terminal in a first discharge mode, whereby the battery can supply a first discharge current to the voltage terminal in the first discharge mode. The hot-swap battery module enters the first discharge mode while started up. In a second discharge mode, the ideal diode controller makes the first power transistor in a partial-conduction state, whereby the battery supplies a second discharge current which is greater than the first discharge current to the voltage terminal. In a third discharge mode, the ideal diode controller is turned off, and the smart chip controls the first power transistor to be in a full-conduction state, whereby the battery supplies a third discharge current which is greater than the second discharge current to the voltage terminal.

In one embodiment, the hot-swap battery module further comprises a charge current-limit switch which is connected with the first power transistor in parallel. In a first charge mode, the charge current-limit switch is turned on to generate a first charge current to charge the battery. In a second charge mode, the ideal diode controller is turned off, and the smart chip turns on the first power transistor to generate a second charge current to charge the battery.

In one embodiment, if the second voltage is within a normal working range while the hot-swap battery module is started up, the smart chip executes a soft start function; if the second voltage is below the normal working range while the hot-swap battery module is started up, the smart chip makes the hot-swap battery module in the first discharge module, whereby to supply the first discharge current to the load; if the second voltage is below the normal working range and also below a preset value while the hot-swap battery module is started up, the smart chip disconnects the hot-swap battery module from the external circuit.

The hot-swap battery module of the present invention uses the smart chip and the ideal diode controller to implement a multi-stage charge or discharge. Consequently, no matter whether hot-swap battery modules have the same voltage/capacity, they can be immediately connected in parallel. When the hot-swap battery module is hot-swapped, the ideal diode controller can fast turn off the first power transistor lest excessive discharge or charge current damage the hot-swap battery module.

DETAILED DESCRIPTION OF THE INVENTION

Figure 1:
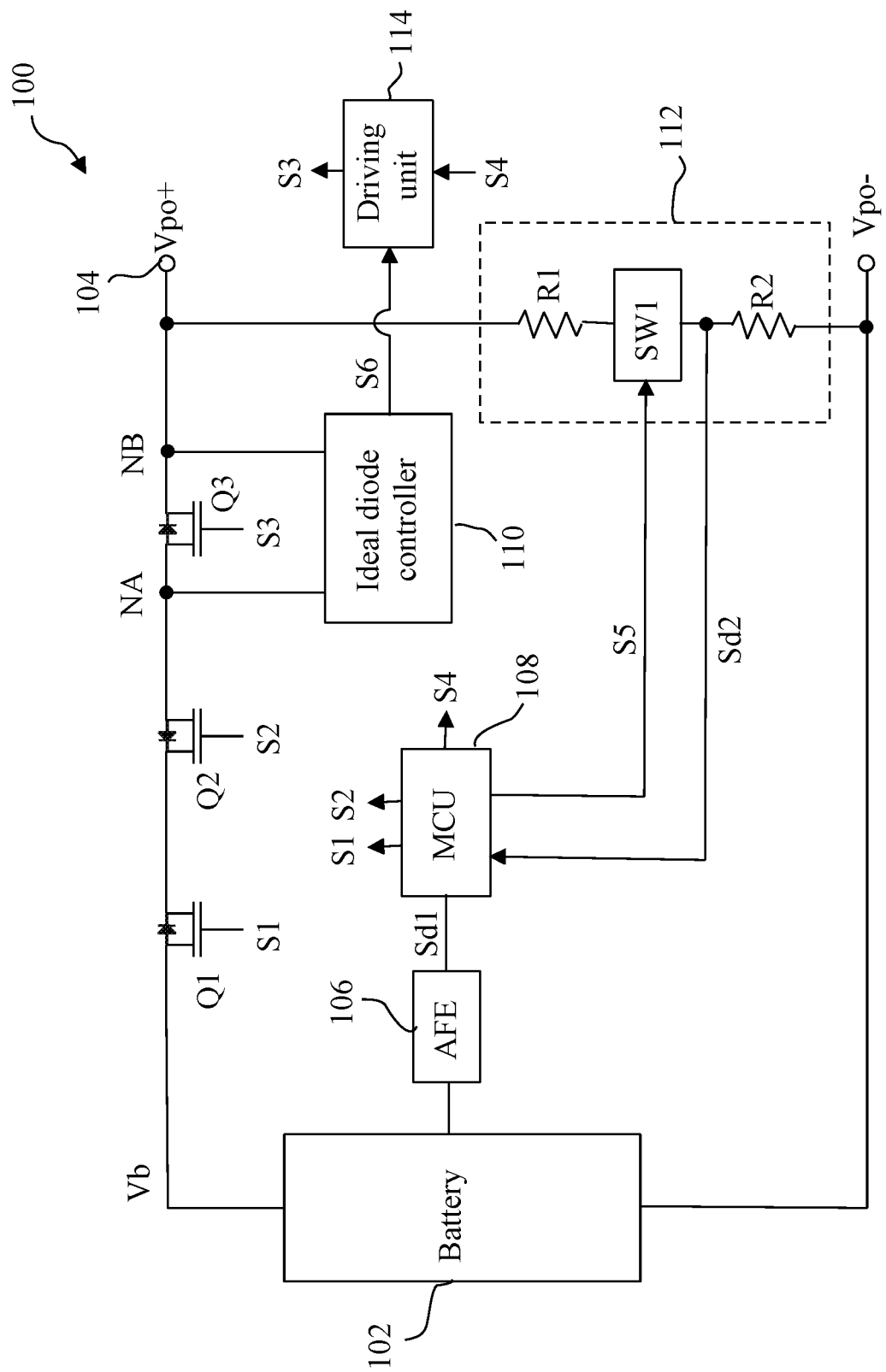
FIG. 1 shows a hot-swap battery module according to a first embodiment of the present invention.

FIG. 1 shows a first embodiment of a hot-swap battery module 100 of the present invention. In the hot-swap battery module 100, a voltage terminal 104 is configured to connect with other battery modules and loads. A charge switch Q1, a discharge switch Q2, and a power transistor Q3 are connected in series between a battery 102 and the voltage terminal 104, and used to control the charging and discharging of the battery module 100. A smart chip 108 provides control signals S1 and S2 to respectively control the charge switch Q1 and the discharge Q2. A driving unit 114 provides a control signal S3 to control the power transistor Q3. The smart chip 108 functions as a microcontroller (MCU) of the battery module 100, able to determine the master-slave relationship of the battery modules, whereby to make a plurality of parallel battery modules 100 to set their master-slave relationship and the individual serial numbers of the battery modules 100 by themselves. The smart chip 108 may also monitor the states of the battery modules 100, such as voltages and capacities, and uses communication or indication lights to show the states of the battery modules 100, whereby the users may determine whether to change the battery modules 100 or whether to change the maximum discharge currents, the maximum charge current or the power of the battery modules 100 according to the shown states. The battery module 100 shown in FIG. 1 also comprises detection circuits 106 and 112. The detection circuit 106 is connected with the battery 102 and the smart chip 108. The detection circuit 106 may be but is not limited to be an Analog Front End (AFE) circuit. The detection circuit 112 is connected with the voltage terminal 104 of the battery module 100 and the smart chip 108. The detection circuit 112 includes a resistor R1, a resistor R2, and a control switch SW1, which are connected in series. The way to implement the detection circuit 112 is not limited to be the architecture shown in FIG. 1. The detection circuit 112 may also be implemented in many other ways.

While the battery module 100 is started up, the detection circuit 106 detects a voltage Vb of the battery 102 so as to generate a detection signal Sd1 to the smart chip 108, and the smart chip 108 provides a control signal S5 to turn on the control switch SW1 to enable the detection circuit 112. Thus, the resistor R1 and the resistor R2 divide the voltage Vpo+ of the voltage terminal 104 and generate a detection signal Sd2 to the smart chip 108. Next, the smart chip 108 generates a control signal S4 according to the detection signals Sd1 and Sd2. Next, the driving unit 114 generates a control signal S3 according to the control signal S4 to control the power transistor Q3. The smart chip 108 may determine whether the voltage Vb of the battery 102 is greater than the voltage Vpo+ of the voltage terminal 104 according to the detection signals Sd1 and Sd2. If the voltage Vb is greater than the voltage Vpo+, the control signal S4 output by the smart chip 108 turns on the power transistor Q3, and then the battery 102 supplies a discharge current to an external battery module or an external load. If the voltage Vb is smaller than the voltage Vpo+, the control signal S4 output by the smart chip 108 turns off the power transistor Q3 lest the battery 102 be reversely charged by a great current.

After the smart chip 108 receives the detection signals Sd1 and Sd2 from the detection circuits 106 and 112, the detection signals Sd1 and Sd2 are processed by a firmware to generate the control signal S4. Once the voltage Vpo+ of the voltage terminal 104 suddenly becomes greater than the voltage Vb of the battery 102, such as the case occurring in hot swapping, the smart chip 108 may be unable to turn off the power transistor Q3 in time. Therefore, the battery module 100 shown in FIG. 1 has an ideal diode controller 110. The ideal diode controller 110 detects the voltage of two terminals NA and NB of the power transistor Q3. The two terminals NA and NB of the power transistor Q3 are respectively coupled to the battery 102 and the voltage terminal 104. Therefore, the ideal diode controller 110 can determine whether the voltage Vb is greater than the voltage Vpo+ according to the voltage of the terminals NA and NB. While the voltage Vb is greater than the voltage Vpo+, the ideal diode controller 110 outputs a control signal S6 to the driving unit 114 to turn on the power transistor Q3. While the voltage Vb is smaller than the voltage Vpo+, the ideal diode controller 110 outputs a control signal S6 to the driving unit 114 to turn off the power transistor Q3. In the present invention, the ideal diode controller 110 uses hardware to process signals. Therefore, the ideal diode controller 110 can rapidly determine whether the voltage Vb is smaller than the voltage Vpo+. Thereby, the hot swapping of the battery module 100 will not damage the battery 102.

Figure 2:
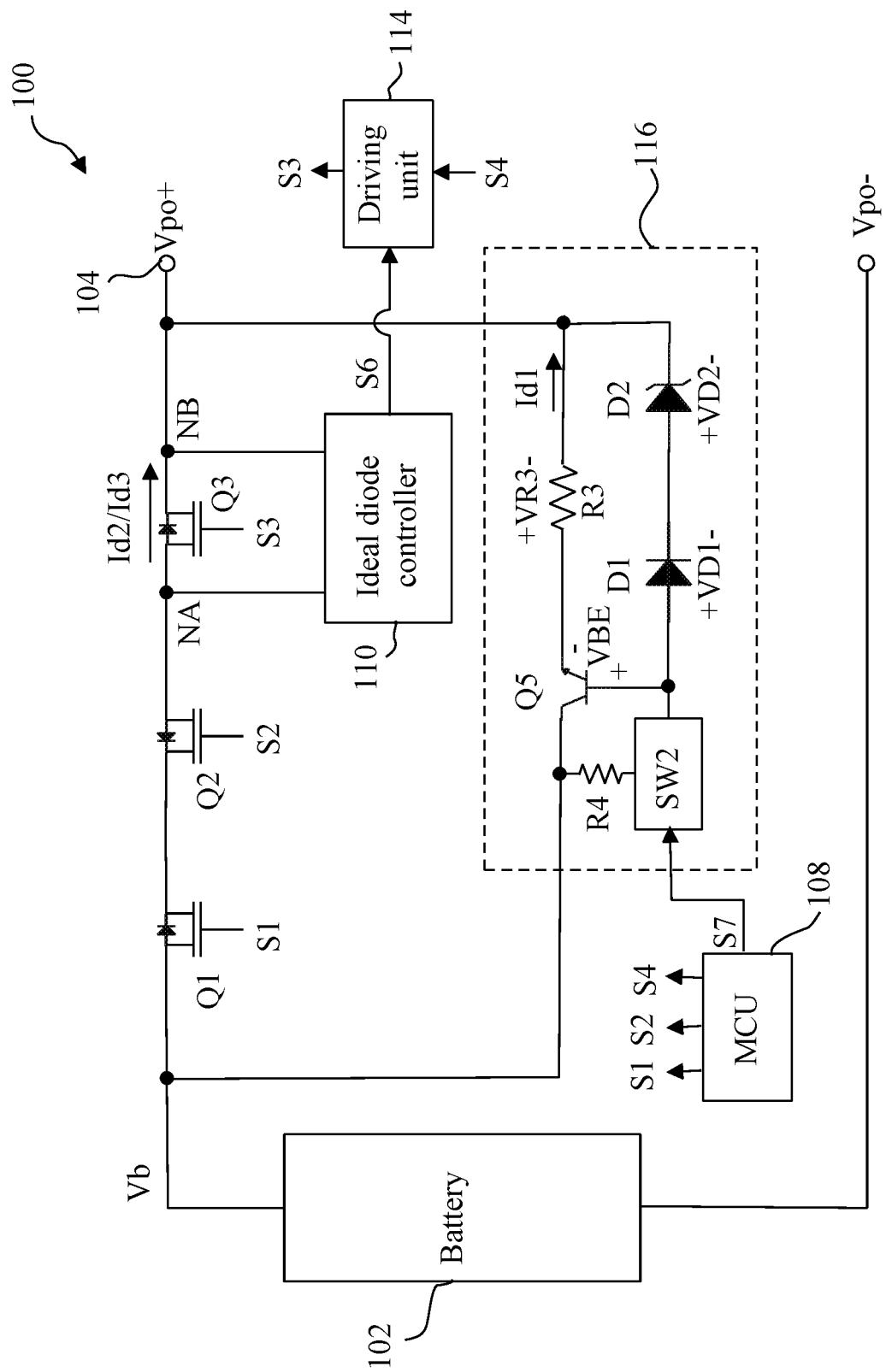
FIG. 2 shows a hot-swap battery module according to a second embodiment of the present invention.

FIG. 2 shows a second embodiment of a hot-swap battery module 100 of the present invention. Similar to the battery module 100 shown in FIG. 1, the battery module 100 shown in FIG. 2 also comprises a battery 102, a charge switch Q1, a discharge switch Q2, a power transistor Q3, a smart chip 108, an ideal diode controller 110 and a driving unit 114. The battery module 100 shown in FIG. 2 further comprises a discharge circuit 116. The discharge circuit 116 includes a power transistor Q5, a resistor R3, a resistor R4, a control switch SW2, a diode D1, and a Zener diode D2. The power transistor Q5 and the resistor R3 are connected in series between the battery 102 and the voltage terminal 104. The diodes D1 and D2 are connected in series between a control terminal of the power transistor Q5 and the voltage terminal 104. The resistor R4 and the control switch SW2 are connected in series between the battery 102 and the control terminal of the power transistor Q5. While the battery module 100 is started up or connected to a load, the battery module 100 enters a first discharge mode. In the first discharge mode, the smart chip 108 generates a control signal S7 to turn on the control switch SW2, whereby the voltage Vb is applied to the control terminal of the power transistor Q5 to turn on the power transistor Q5. Thus, the discharge circuit 116 is turned on to form a discharge path between the battery 102 and the voltage terminal 104. Then, the battery 102 supplies a discharge current Id1 to the voltage terminal 104. In the discharge circuit 116, "VBE+VR3" is equal to "VD1+VD2". Therefore, the discharge current Id1 may be determined by selecting the resistor R3 having a different resistance or a Zener diode D2 having a different voltage VD2, so that the discharge current Id1 may be within 0.1 A-3 A.

If the current required by the external load is greater than the discharge current Id1 supplied by the discharge circuit 116, the smart chip 108 sends out control signals S1 and S2 to turn on the switches Q1 and Q2. At this moment, the ideal diode controller 110 determines whether the voltage Vb is greater than the voltage Vpo+. If the voltage Vb is greater than the voltage Vpo+, the ideal diode controller 110 makes the power transistor Q3 in a partial-conduction state so as to make the battery 102 supply a discharge current Id2 which is greater than the discharge current Id1. In such a case, the battery module 100 enters a second discharge mode. The ideal diode controller 110 has a voltage-clamping function, so the ideal diode controller 110 is able to limit the voltage of the two terminals of the power transistor Q3 to a given range and make power transistor Q3 in a semi-conduction state. Thus, the discharge current Id2 is limited to be within 20 A-50 A.

The smart chip 108 shown in FIG. 2 constantly monitors the voltage, the discharge current and the capacity of the battery module 100. Through a communication mechanism, the smart chip 108 also communicates with the smart chips of the other parallel battery modules to acquire the information of the voltages, capacities, and the charge/discharge currents of the other battery modules. While the following conditions are satisfied: the voltage Vb is greater than the voltage Vpo+; the difference of the voltage Vb and the voltage Vpo+ is smaller than a first preset value; and the differences of the capacity of the battery module 100 and the capacities of other battery modules are smaller than a second preset value, the battery module 100 enters a third discharge mode. In the third discharge mode, the smart chip 108 turns off the ideal diode controller 110 and sends out a control signal S4 to the driving unit 114 to make the power transistor Q3 in a full-conduction state. Thereby, a discharge current Id3 which is greater than the discharge Id2 is generated. The discharge current Id3 is within 100 A-120 A.

The battery module 100 shown in FIG. 2 has a multi-stage automatic balance function. In the first and second discharge modes, the battery module 100 supplies smaller discharge currents Id1 and Id2 to prevent from greater current charging and damaging loads or other battery modules. While the balance between the battery module 100 and loads/other battery modules is achieved (the difference of the voltage Vb and the voltage Vpo+ is smaller than a first preset value; and the differences of the capacity of the battery module 100 and the capacities of other battery modules are smaller than a second preset value), the battery module 100 enters the third discharge mode and generates a greater discharge current Id3.

Figure 3:
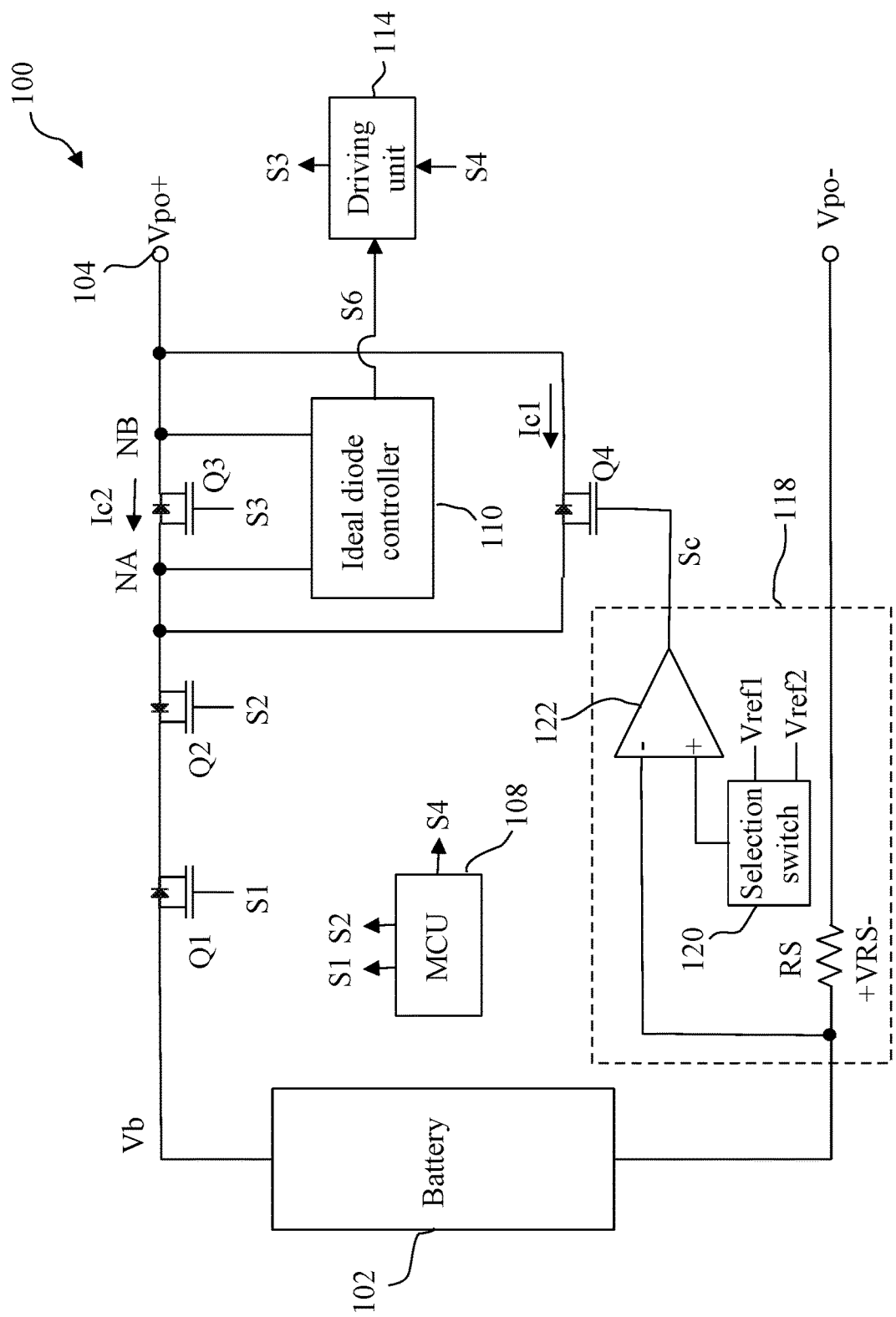
FIG. 3 shows a hot-swap battery module according to a third embodiment of the present invention.

FIG. 3 shows a third embodiment of a hot-swap battery module 100 of the present invention. Similar to the battery module 100 shown in FIG. 1, the battery module 100 shown in FIG. 3 also comprises a battery 102, a charge switch Q1, a discharge switch Q2, a power transistor Q3, a smart chip 108, an ideal diode controller 110 and a driving unit 114. The battery module 100 in FIG. 3 is different from the battery module 100 in FIG. 1 in that the battery module 100 in FIG. 3 further comprises a charge current-limit switch Q4 and a sensing circuit 118. The charge current-limit switch Q4 is connected with the power transistor Q3 in parallel. The sensing circuit 118 senses the charge current supplied to the battery 102, whereby to control the turn-on or turn-off of the charge current-limit switch Q4. The sensing circuit 118 includes a sensing resistor RS, a reference voltage Vref1, a reference voltage Vref2, a selection switch 120, and a comparator 122. The sensing resistor RS is connected with the battery 102 in series. The comparator 122 compares the voltage VRS of the sensing resistor RS with the reference voltage Vref1 or Vref2 and then generates a comparison signal Sc to turn on or turn off the charge current-limit switch Q4. The reference voltages Vref1 and Vref2 are preset values. According to the control signal from the smart chip 108, the selection switch 120 provides the reference voltage Vref1 or Vref2 to the comparator 122.

In FIG. 3, the battery module 100 enters a first charge mode while the following conditions are satisfied: the voltage Vb is smaller than the voltage Vpo+; and the difference of the voltage Vb and the voltage Vpo+ is smaller than a first preset value TH1. In the first charge mode, the ideal diode controller 110 turns off the power transistor Q3, and the comparator 122 turns on the charge current-limit switch Q4. Then, a charge current Ic1 charges the battery 102 to increase the voltage Vb of the battery 102 through the charge current-limit switch Q4, the discharge switch Q2 and the charge switch Q1. While the charge current Ic1 flows through the sensing resistor RS, a voltage VRS is generated. While the voltage VRS is greater than the reference voltage Vref1 or Vref2, the comparator 122 turns off the charge current-limit switch Q4 lest the charge current Ic1 becomes greater than a second preset value TH2. The second preset value TH2 varies with the reference voltages Vref1 and Vref2. While the voltage VRS is smaller than the reference voltage Vref1 or Vref2, the comparator 122 turns on the charge current-limit switch Q4. By turning on and turning off the charge current-limit switch Q4 cyclically, the charge current Ic1 is maintained at the second preset value TH2. The smart chip 108 may vary the value of the charge current Ic1 by selecting a different reference voltage Vref1 or Vref2. The charge current Ic1 is about within 2 A-20 A. While the following conditions are satisfied: the voltage Vb is smaller than the voltage Vpo+; the difference of the voltage Vb and the voltage Vpo+ is smaller than the first preset value TH1; and the differences of the capacity of the battery module 100 and the capacities of other battery modules are smaller than a third preset value TH3, the battery module 100 enters a second charge mode. In the second charge mode, the ideal diode controller 110 is turned off, and the smart chip 108 sends out a control signal S4 to the driving unit 114 to turn on the power transistor Q3; then a charge current Ic2 which is greater than the charge current Ic1 is generated to charge the battery 102 through the power transistor Q3. Thus, the time for charging is shortened. The charge current Ic2 is about within 0-120 A.

The battery module 100 shown in FIG. 3 has a multi-stage automatic balance function. In the first charge mode, a smaller charge current Ic1 is used to charge the battery 102 lest an excessive charge current damage the battery 102. While the balance between the battery module 100 and loads/other battery modules is achieved (the difference of the voltage Vb and the voltage Vpo+ is smaller than a first preset value TH1; and the differences of the capacity of the battery module 100 and the capacities of other battery modules are smaller than a third preset value TH3), the battery module 100 enters the second discharge mode, a larger charge current Ic2 is used to charge the battery 102, whereby the charging time is shortened.

The battery module 100 shown in FIG. 2 and FIG. 3 use the power transistors (Q3, Q4 and Q5) and the operational amplifiers (110 and 112) as the current control elements. Thus, the range of the working current is significantly raised; the area is reduced; and the generated heat is decreased. Therefore, the battery module of the present invention is distinct from the conventional battery modules that use power resistors to limit current.

Figure 4:
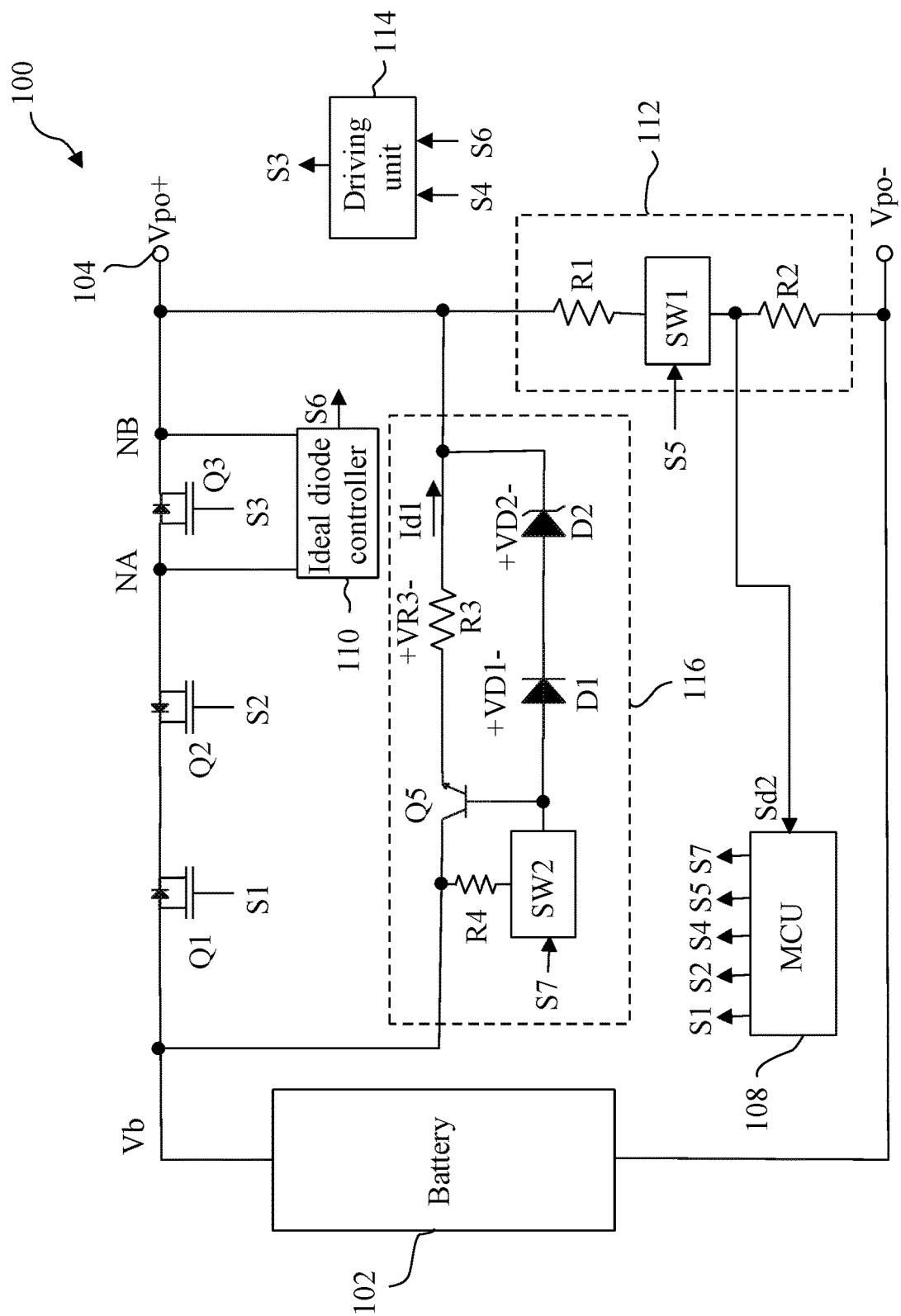
FIG. 4 shows a hot-swap battery module according to a fourth embodiment of the present invention.

FIG. 4 shows a fourth embodiment of a hot-swap battery module 100 of the present invention. Similar to the battery module 100 shown in FIG. 1, the battery module 100 shown in FIG. 4 also comprises a battery 102, a charge switch Q1, a discharge switch Q2, a power transistor Q3, a smart chip 108, an ideal diode controller 110, a detection circuit 112 and a driving unit 114. The battery module 100 in FIG. 4 is different from the battery module 100 in FIG. 1 in that the battery module 100 in FIG. 4 further comprises a discharge circuit 116. While the battery module 100 is started up, the charge switch Q1, the discharge switch Q2 and the power transistor Q3 are turned off; the smart chip 108 sends out control signals S5 and S7 to respectively turn on the detection circuit 112 and the discharge circuit 116. Thus, the detection circuit 112 detects the voltage Vpo+ of the voltage terminal 104 and generates a detection signal Sd2 to the smart chip 108; the discharge circuit 116 generates a discharge current Id1 to charge a load connected to the voltage terminal. The detail of the operation of the discharge circuit 116 has been described in the embodiment of FIG. 2. While the smart chip 108 determines that the voltage Vpo+ is within the normal working range of the battery module 100 according to the detection signal Sd2, the smart chip 108 executes a soft start function. After the soft start, the battery module 100 enters a normal working mode, and the switches Q1 and Q2 are turned on. While the smart chip 108 determines that the voltage Vpo+ is below the normal working range according to the detection signal Sd2, the power transistor Q5 is kept turning on to supply a discharge current Id1 to charge loads. While the smart chip 108 determines that the voltage Vpo+ is below the normal working range and also below a preset value according to the detection signal Sd2, the smart chip 108 would further determine that the load is short-circuited. Thus, the smart chip 108 turns off the power transistor Q5 to disconnect the battery module 100 from the external circuit. The smart chip 108 may use LED lights or a communication means to alarm the user.

The embodiments have been described above to demonstrate the principles of the present invention and enable the persons skilled in the art to understand, make, and use the present invention. However, these embodiments are only to exemplify the present invention but not to limit the scope of the present invention. The technical thought and scope of the present invention is defined by the claims stated below and the equivalents thereof. Any modification or variation according to the principle, spirit or embodiment of the present invention is to be also included by the scope of the present invention.

What is claimed is:

1. A hot-swap battery module comprising:
   a voltage terminal configured to connect to other battery modules or loads;
   a battery providing a first voltage;
   a charge switch;
   a discharge switch;
   a first power transistor connected with said charge switch and said discharge switch in series between said voltage terminal and said battery;
   a smart chip coupled to said first power transistor and turning off said first power transistor while said first voltage is smaller than a second voltage of said voltage terminal; and
   an ideal diode controller coupled to said first power transistor and turning off said first power transistor while a third voltage of a first terminal of said first power transistor is greater than a fourth voltage of a second terminal of said first power transistor, wherein said first terminal of said first power transistor is coupled to said voltage terminal, and said second terminal of said first power transistor is coupled to said battery.

2. The hot-swap battery module according to claim 1 further comprising:
   a first detection circuit connected with said battery and said smart chip, and detecting said first voltage to generate a first detection signal; and
   a second detection circuit connected with said voltage terminal and said smart chip, and detecting said second voltage to generate a second detection signal;
   wherein, said smart chip determines whether said first voltage is greater than said second voltage according to said first detection signal and said second detection signal.

3. The hot-swap battery module according to claim 1 further comprising a driving unit connected with said first power transistor, said smart chip and said ideal diode controller, wherein said driving unit turns on or turns off said first power transistor according to outputs of said smart chip and said ideal diode controller.

4. The hot-swap battery module according to claim 1 further comprising a discharge circuit connected with said charge switch, said discharge switch and said first power transistor in parallel and configured to form a discharge path between said battery and said voltage terminal in a first discharge mode to make said battery supply a first discharge current to said voltage terminal, wherein said hot-swap battery module enters said first discharge mode while said hot-swap battery module is started up.

5. The hot-swap battery module according to claim 4, wherein said discharge circuit includes:
   a second power transistor between said battery and said voltage terminal turned on in said first discharge mode to generate said first discharge current;
   a resistor connected with said second power transistor in series;
   a first diode; and
   a second diode connected with said first diode in series between said voltage terminal and a control terminal of said second power transistor, wherein said second diode is a Zener diode.

6. The hot-swap battery module according to claim 4, wherein while said first voltage is greater than said second voltage, said hot-swap battery module enters a second discharge mode; in said second discharge mode, said ideal diode controller makes said first power transistor in a partial-conduction state so as to make said battery supply a second discharge current which is greater than said first discharge current to said voltage terminal.

7. The hot-swap battery module according to claim 6, wherein while said first voltage is greater than said second voltage and a difference of said first voltage and said second voltage is smaller than a preset value, said hot-swap battery module enters a third discharge mode; in said third discharge mode, said ideal diode controller is turned off, and said smart chip makes said first power transistor in a full-conduction state so as to make said battery supply a third discharge current which is greater than said second discharge current to said voltage terminal.

8. The hot-swap battery module according to claim 1 further comprising a charge current-limit switch which is connected with said first power transistor in parallel and is turned on in a first charge mode to generate a first charge current to charge said battery, wherein while said first voltage is smaller than said second voltage and a difference of said first voltage and said second voltage is greater than a first preset value, said hot-swap battery module enters said first charge mode.

9. The hot-swap battery module according to claim 8 further comprising a sensing circuit connected with said charge current-limit switch, wherein said sensing circuit senses said first charge current in said first charge mode for turning on or turning off said charge current-limit switch so as to maintain said first charge current at a second preset value.

10. The hot-swap battery module according to claim 9, wherein said smart chip controls said second preset value to vary a value of said first charge current.

11. The hot-swap battery module according to claim 8, wherein while said first voltage is smaller than said second voltage and a difference of said first voltage and said second voltage is smaller than said first preset value, said hot-swap battery module enters a second charge mode; in said second charge mode, said ideal diode controller is turned off, and said smart chip turns on said first power transistor to generate a second charge current to charge said battery.

12. The hot-swap battery module according to claim 4, wherein while said hot-swap battery module is in said first discharge mode and said second voltage is within a normal working range, said smart chip executes a soft start function.

13. The hot-swap battery module according to claim 4, wherein while said hot-swap battery module is in said first discharge mode and said second voltage is below a normal working range, said hot-swap battery module is maintained in said first discharge mode.

14. The hot-swap battery module according to claim 4, wherein while said hot-swap battery module is in said first discharge mode and said second voltage is lower than a preset value, said discharge circuit is turned off, and said smart chip sends out a short-circuit signal.

15. A method for controlling a hot-swap battery module, wherein said hot-swap battery module comprises a voltage terminal connected with other battery modules or loads, a battery providing a first voltage, a charge switch, a discharge switch, and a first power transistor connected with said charge switch and said discharge switch in series between said voltage terminal and said battery, comprising the steps of:
using a smart chip to turn off said first power transistor while said first voltage is smaller than a second voltage of said voltage terminal; and
using an ideal diode controller to turn off said first power switch while a third voltage of a first terminal of said first power transistor is greater than a fourth voltage of a second terminal of said first power transistor;
wherein, said first terminal of said first power transistor is coupled to said voltage terminal; said second terminal of said first power transistor is coupled to said battery.

16. The method according to claim 15 further comprising a step: forming a discharge path between said battery and said voltage terminal in a first discharge mode to make said battery supply a first discharge current to said voltage terminal, wherein said hot-swap battery module enters said first discharge mode when said hot-swap battery module is started up.

17. The method according to claim 16 further comprising a step: in a second discharge mode, making said first power transistor in a partial-conduction state so as to make said battery supply a second discharge current which is greater than said first discharge current to said voltage terminal, wherein said hot-swap battery module enters said second discharge mode while said first voltage is greater than said second voltage.

18. The method according to claim 17 further comprising a step: in a third discharge mode, turning off said ideal diode controller and making said first power transistor in a full-conduction state so as to make said battery supply a third discharge current which is greater than said second discharge current to said voltage terminal, wherein said hot-swap battery module enters said third discharge mode while said first voltage is greater than said second voltage and a difference of said first voltage and said second voltage is smaller than a preset value.

19. The method according to claim 15 further comprising a step: in a first charge mode, turning on a charge current-limit switch which is connected with said first power transistor in parallel to generate a first charge current to charge said battery, wherein said hot-swap battery module enters said first charge mode while said first voltage is smaller than said second voltage and a difference of said first voltage and said second voltage is greater than a first preset value.

20. The method according to claim 19 further comprising a step: in said first charge mode, sensing said first charge current for turning on or turning off said charge current-limit switch so as to maintain said first charge current at a second present value.

21. The method according to claim 20 further comprising a step: controlling said second preset value to vary a value of said first charge current.

22. The method according to claim 19 further comprising a step: turning off said ideal diode controller and turning on said first power transistor in a second charge mode to generate a second charge current which is greater than said first charge current to charge said battery, wherein said hot-swap battery module enters said second charge mode while said first voltage is smaller than said second voltage and a difference of said first voltage and said second voltage is smaller than said first preset value.

23. The method according to claim 16, wherein while said hot-swap battery module is in said first discharge mode and said second voltage is within a normal working range, said smart chip executes a soft start function.

24. The method according to claim 16, wherein while said hot-swap battery module is in said first discharge mode and said second voltage is below a normal working range, said battery module is maintained in said first discharge mode.

25. The method according to claim 16, wherein while said hot-swap battery module is in said first discharge mode and said second voltage is lower than a preset value, said discharge circuit is turned off, and said smart chip sends out a short-circuit signal.

* * * * *